United States Patent [19]

Marum et al.

[11] Patent Number: 5,500,546
[45] Date of Patent: Mar. 19, 1996

[54] ESD PROTECTION CIRCUITS USING ZENER DIODES

[75] Inventors: Steven E. Marum, Sherman, Tex.; Karl-Heinz Kraus, Freising, Germany

[73] Assignee: Texas Instruments Incorporated, Dallas, Tex.

[21] Appl. No.: 308,005

[22] Filed: Sep. 16, 1994

[51] Int. Cl.⁶ .............................. H01L 23/62; H02H 9/00
[52] U.S. Cl. ..................... 257/358; 257/360; 257/363; 257/481; 257/551; 257/546; 361/56; 361/58; 361/100
[58] Field of Search ..................... 257/358, 360, 257/363, 481, 546, 551; 361/56, 58, 100

[56] References Cited

U.S. PATENT DOCUMENTS

| | | | |
|---|---|---|---|
| 4,896,243 | 1/1990 | Chatterjee et al. | 362/91 |
| 5,012,317 | 4/1991 | Rountre | 357/38 |
| 5,060,037 | 10/1991 | Rountre | 357/23 |
| 5,077,591 | 12/1991 | Chen et al. | 357/23 |
| 5,223,737 | 6/1993 | Canclini | 257/546 |
| 5,225,702 | 7/1993 | Chatterjee | 257/360 |
| 5,268,588 | 12/1993 | Marum | 257/362 |
| 5,290,724 | 3/1994 | Leach | 437/51 |

*Primary Examiner*—Edward Wojciechowicz
*Attorney, Agent, or Firm*—Thomas G. Eschweiler; James C. Kesterson; Richard L. Donaldson

[57] ABSTRACT

An electrostatic discharge protection circuit 11 coupled between an input pad 12 and operational circuitry 20 includes a primary clamp circuit 14 coupled to input pad 12, and a current limit circuit 16 coupled to primary clamp circuit 14. Primary clamp circuit 14 clamps an electrostatic discharge voltage to a first voltage value. Operational circuitry 20, susceptible to damage due to an electrostatic discharge, is coupled to current limit circuit 16 and a zener diode 30 is coupled between current limit circuit 16 and a ground potential. Zener diode 30 has a cathode terminal coupled to current limit circuit 16 and an anode terminal coupled to ground potential. Zener diode 30 further clamps a voltage across operational circuitry 20 to a second voltage which is less than 10 V, thereby protecting operational circuitry 20 from damage due to electrostatic discharge.

13 Claims, 6 Drawing Sheets

ESD PROTECTION CIRCUITS USING ZENER DIODES

FIELD OF THE INVENTION

This invention relates to electronic circuits and more particularly relates to electrostatic discharge (ESD) protection circuits.

BACKGROUND OF THE INVENTION

Electrostatic discharge (ESD) protection circuits are utilized to protect input and output circuitry from ESD as taught in prior art U.S. Pat. No. 5,268,588, U.S. Pat. No. 4,896,243, U.S. Pat. No. 5,077,591, U.S. Pat. No. 5,060,037, U.S. Pat. No. 5,012,317, U.S. Pat. No. 5,225,702 and U.S. Pat. No. 5,290,724 all assigned to Texas Instruments, Inc.

Figure 1:
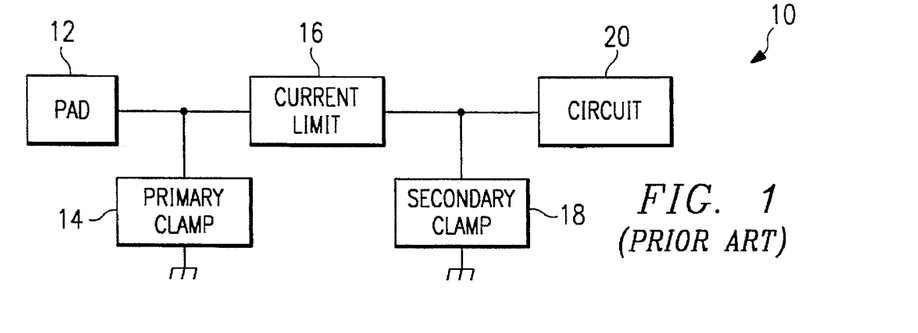
FIG. 1 is a block diagram illustrating a prior art input ESD protection circuit 10.

Many ESD protection circuits utilize a two stage protection scheme on circuit inputs as shown in prior art FIG. 1. Typically the high current pulse of an ESD strike passes through the primary clamp which clamps the pad voltage. However this is still too high a voltage for the circuitry to receive, therefore the secondary clamp clamps the voltage to a safe value. The current limit structure limits the current so that the secondary clamp does not have to be excessively large.

As complimentary oxide semiconductor (CMOS) processes evolve to transistor shorter channel lengths and thinner gate oxides, it becomes more difficult to protect both input and output circuits from damage due to ESD. For example, as the gate oxide of transistors become thinner, the breakdown voltage of the gate oxide will become lower than the breakdown voltages of the standard CMOS process flow diffusions. Therefore the standard prior art ESD clamps will no longer protect the gate oxide from ESD because the gate oxide will fail before the ESD clamp begins to clamp the ESD pulse.

Prior art primary clamps also suffer from limitations. They exhibit high clamping voltages that provide little headroom for "IR" drops that occur in electrostatic discharge protection circuits due to the large currents and small metallization resistance. A primary clamp circuit that could clamp ESD pulses at lower voltage levels would be beneficial.

Output circuits also suffer from low ESD level damage. If the output device evenly breaks down it absorbs the ESD energy. However, the output device may not turn on completely or evenly, but rather will conduct in localized areas at a voltage value lower than the device breakdown. When this occurs, a "hot spot" is created and the device suffers damage.

It is an object of this invention to provide an ESD protection circuit that protects both circuit inputs and outputs from ESD. Other objects and advantages of the invention will become apparent to those of ordinary skill in the art having reference to the following specification together with the drawings herein.

SUMMARY OF THE INVENTION

An electrostatic discharge protection circuit 11 coupled between an input pad 12 and operational circuitry 20 includes a primary clamp circuit 14 coupled to input pad 12, and a current limit circuit 16 coupled to primary clamp circuit 14. Primary clamp circuit 14 clamps an electrostatic discharge voltage to a first voltage value. Operational circuitry 20, susceptible to damage due to an electrostatic discharge, is coupled to current limit circuit 16 and a first zener diode 30 is coupled between current limit circuit 16 and a ground potential. First zener diode 30 has a cathode terminal coupled to current limit circuit 16 and an anode terminal coupled to ground potential. First zener diode 30 further clamps a voltage across operational circuitry 20 to a second voltage which is less than 10 V, thereby protecting operational circuitry 20 from damage due to electrostatic discharge.

BRIEF DESCRIPTION OF THE DRAWINGS

FIG. 2b is a cross section diagram illustrating zener diode 30 of FIG. 2 and FIG. 2a.

FIG. 4b is a graph illustrating the advantages of gridded zener diode 70 of FIG. 4 and FIG. 4a.

FIG. 5b is a cross section diagram illustrating amplified zener diode circuit 80 of FIG. 5 and FIG. 5a.

FIG. 7b is a cross section diagram illustrating alternative zener triggered SCR circuit 100 of FIG. 7 and FIG. 7a.

DETAILED DESCRIPTION OF THE PREFERRED EMBODIMENT

Figure 2:
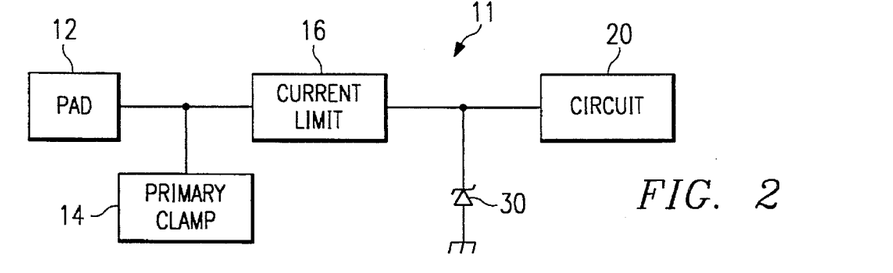
FIG. 2 is a combined block diagram/schematic diagram illustrating an embodiment of the invention, a novel input ESD protection circuit 10.

FIG. 2 is a combined block diagram/schematic diagram illustrating an embodiment of the invention, an input ESD protection circuit 11 utilizing a zener diode 30 as a secondary clamp. An input pad 12 is connected to a primary clamp 14 and a current limit 16. Current limit 16 is also connected to zener diode 30 which clamps the voltage to a level that is safe, thereby protecting the gate oxide of MOS transistor devices in a circuit 20.

Figure 2A:
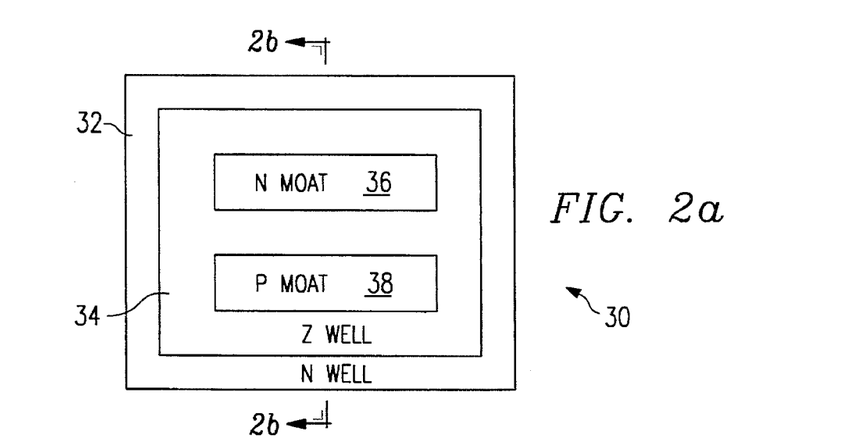
FIG. 2a is a circuit layout diagram illustrating a zener diode 30 of FIG. 2.

FIG. 2a is a circuit layout diagram illustrating zener diode 30 of FIG. 2. Zener diode 30 includes an N-well region 32 in a P type substrate. A Z-well region 34 is formed within N-well region 32. An N-moat region 36 and a P-moat region 38 are formed within Z-well region 34. Z-well region 34 is an N+ region that, combined with P-moat region 38 forms zener diode 30. Z-well region 34 dopant concentration may be varied to alter the breakdown voltage of zener diode 30. For example a doping concentration of $1.0 \times 10^{17}/cm^3$ provides a zener breakdown of 8 V, a doping concentration of $1.3 \times 10^{17}/cm^3$ provides a zener breakdown of 7 V and a doping concentration of $1.6 \times 10^{17}/cm^3$ provides a zener breakdown of 6 V.

Figure 2B:
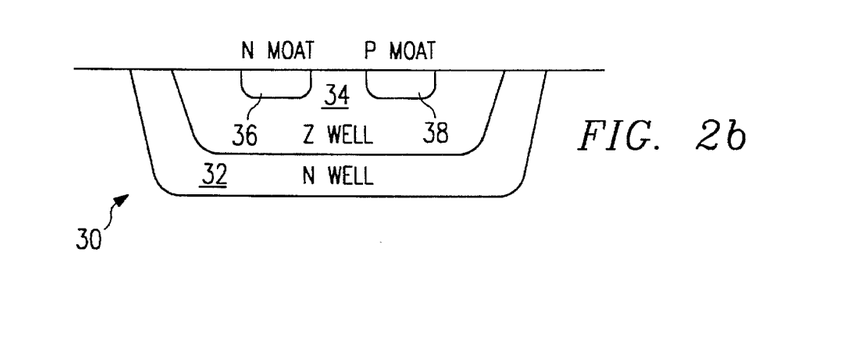

FIG. 2b is a cross section diagram illustrating zener diode 30 of FIG. 2 and FIG. 2a. FIG. 2b illustrates how zener diode 30 of FIG. 2a looks if zener diode 30 were cut down the middle and rotated 90 degrees.

Figure 3:
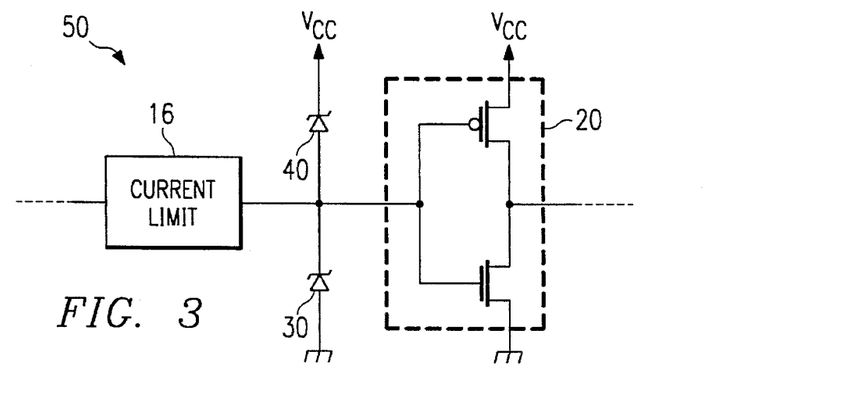
FIG. 3 is a combined block diagram/schematic diagram illustrating a secondary clamp circuit 50 in an input ESD protection circuit.

FIG. 3 is a combined block diagram/schematic diagram illustrating a secondary clamp circuit 50. Secondary clamp circuit 50 includes zener diode 30 of FIG. 2 and a second zener diode 40 coupled between zener diode 30 and supply voltage Vcc. Circuit 20 is illustrated as a CMOS inverter input. Circuit 50 differs from zener diode 30 alone because when driving a CMOS input, the PMOS transistor needs to be protected from negative ESD pulses in the same manner as NMOS transistors need be protected from positive ESD pulses.

Figure 3A:
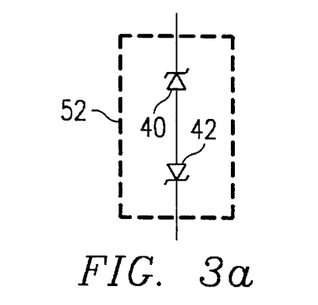
FIG. 3a is a schematic diagram illustrating an alternative circuit arrangement 52 for zener diode 40 of FIG. 3.

FIG. 3a is a schematic diagram illustrating an alternative circuit arrangement for zener diode 40 of FIG. 3. In FIG. 3a, a circuit 52 has a zener diode 40 and a zener diode 42 coupled together anode-to-anode. Circuit 52 may replace zener diode 40 of FIG. 3.

Figure 3B:
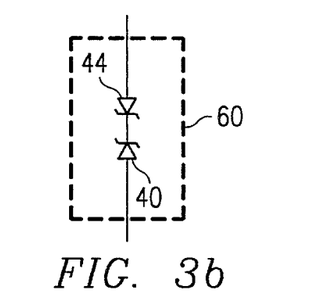
FIG. 3b is a schematic diagram illustrating another alternative circuit arrangement 60 for zener diode 40 of FIG. 3.

FIG. 3b is a schematic diagram illustrating another alternative circuit arrangement for zener diode 40 of FIG. 3. In FIG. 3b, a circuit 60 has a zener diode 40 and a zener diode 44 coupled together cathode-to-cathode. Circuit 60 may also replace zener diode 40 of FIG. 3.

Figure 3C:
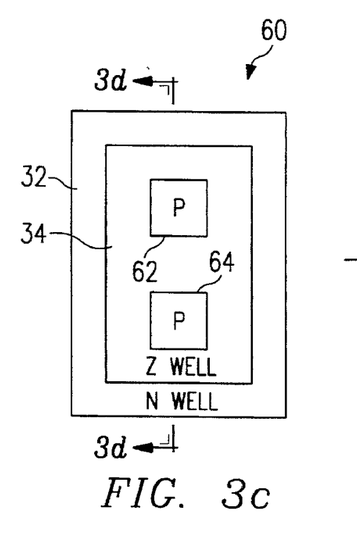
FIG. 3c is a circuit layout diagram illustrating circuit 60 of FIG. 3b.

FIG. 3c is a circuit layout diagram of circuit 60 of FIG. 3b. Circuit 60 includes N-well region 32 in the substrate. Z-well region 34 is formed within N-well region 32. A first P type region 62 and a second P type region 64 are formed within Z-well region 34.

Figure 3D:
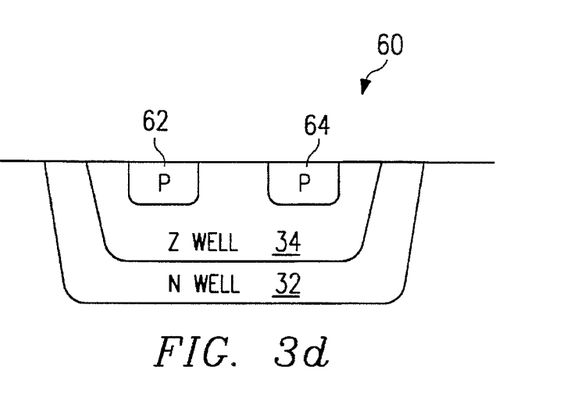
FIG. 3d is a cross section diagram illustrating circuit 60 of FIG. 3b and FIG. 3c.

FIG. 3d is a cross section diagram illustrating circuit 60 of FIG. 3b and FIG. 3c. FIG. 3d illustrates how circuit 60 of FIG. 3c looks if it were cut down the middle and rotated 90 degrees.

Figure 4:
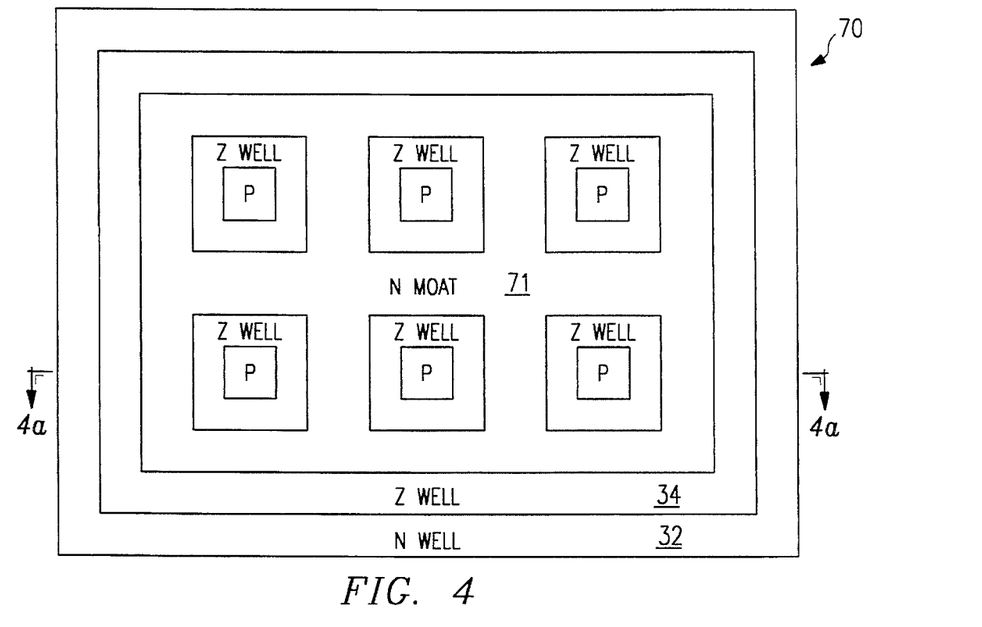
FIG. 4 is a circuit layout diagram illustrating a gridded zener diode 70.

FIG. 4 is a circuit layout diagram illustrating a gridded zener diode 70 for use as a primary clamping mechanism such as primary clamp 14 of FIG. 2 for an input ESD protection circuit. N-well region 32 is formed in the substrate. A Z-well region 34 is formed within N-well region 32. An N-moat region 71 is formed in Z-well region 34 with a plurality of openings. A plurality of P regions 72 are formed within the plurality of openings in N-moat region 71.

Figure 4A:
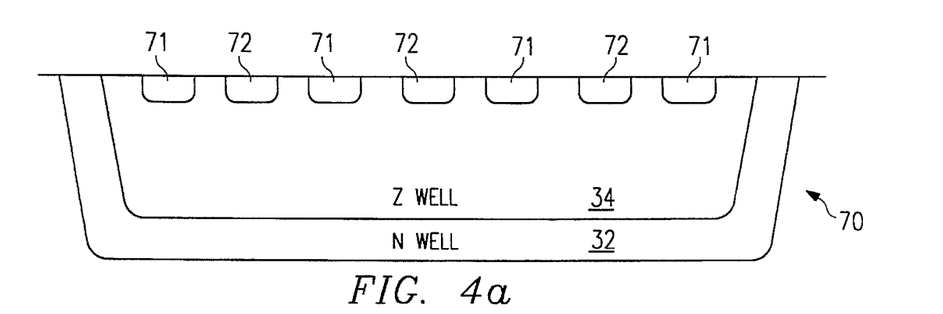
FIG. 4a is a cross section diagram illustrating gridded zener diode 70 of FIG. 4.

FIG. 4a is a cross section diagram illustrating zener diode 70 of FIG. 4. FIG. 4a illustrates how zener diode 70 of FIG. 4 looks if zener diode 70 is cut down the middle longitudinally in the area marked in FIG. 4.

Figure 4B:
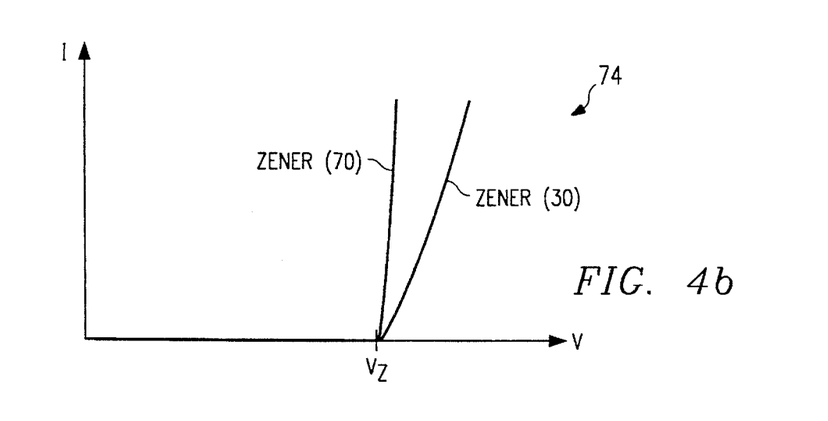

FIG. 4b is a graph illustrating the advantages of gridded zener diode 70 of FIG. 4 over that of zener diode 30 if FIG. 2a. FIG. 4b illustrates the voltage and current relationship of zener diodes 30 and 70. Voltage (V) is on the horizontal axis while current (I) is on the vertical axis. $V_z$ represents the breakdown voltages of zener diodes 30 and 70.

Figure 5:
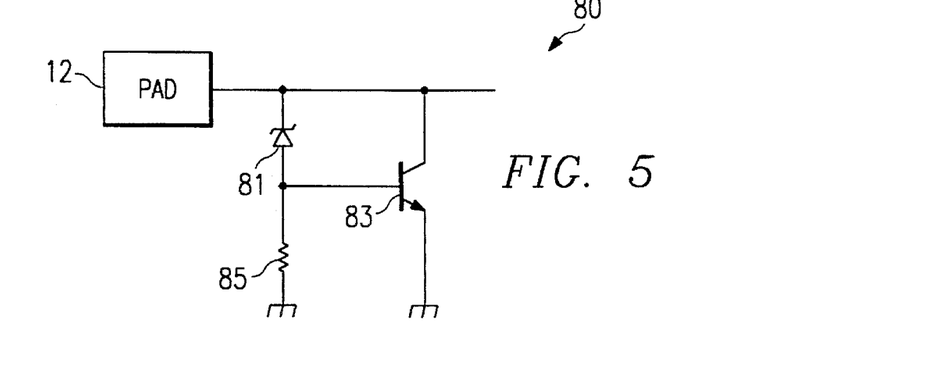
FIG. 5 is a schematic diagram illustrating an amplified zener diode circuit 80.

FIG. 5 is a schematic diagram illustrating an amplified zener diode circuit 80 that could be used as a primary clamp 14 illustrated in FIG. 2. Amplified zener diode circuit 80 includes a zener diode 81 coupled serially between pad 12 and a resistor 85. An anode of zener diode 81 is connected to a base terminal of an NPN transistor 83 which is coupled between pad 12 and circuit ground. Amplified zener diode circuit 80 reduces power dissipation when used as a primary clamp by shunting current through NPN transistor 83 after zener diode 81 breaks down.

Figure 5A:
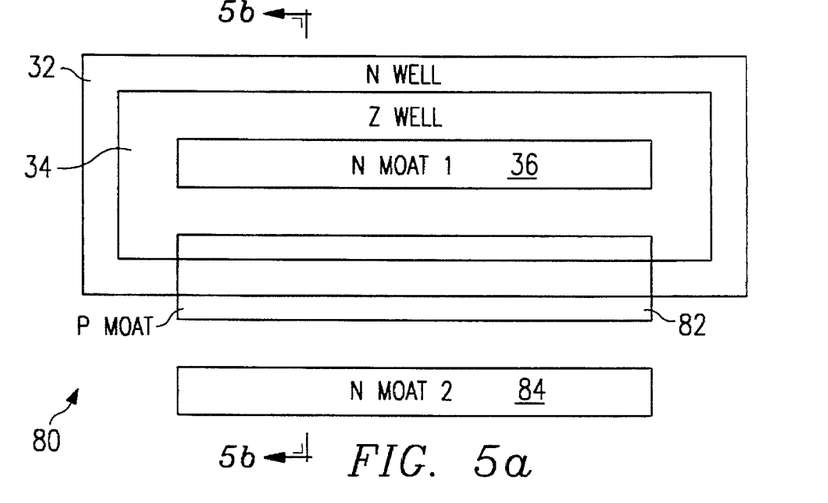
FIG. 5a is a circuit layout diagram illustrating amplified zener diode circuit 80 of FIG. 5.

FIG. 5a is a circuit layout diagram illustrating amplified zener diode circuit 80 excluding resistor 85. Both N-well region 32 and N-moat 2 region 84 are formed in the substrate. Z-well region 34 is formed within N-well region 32. An N-moat 1 region 36 is formed within Z-well region 34. A P-moat region 82 is formed straddling Z-well region 34, N-well region 32 and the substrate.

Figure 5B:
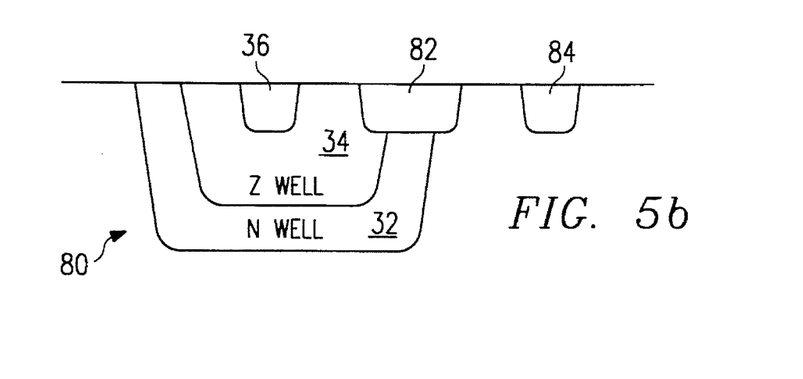

FIG. 5b is a cross section diagram illustrating amplified zener diode circuit 80 of FIG. 5 and FIG. 5a. FIG. 5b illustrates how amplified zener diode circuit 80 looks if cut down the middle and rotated 90 degrees.

Figure 6:
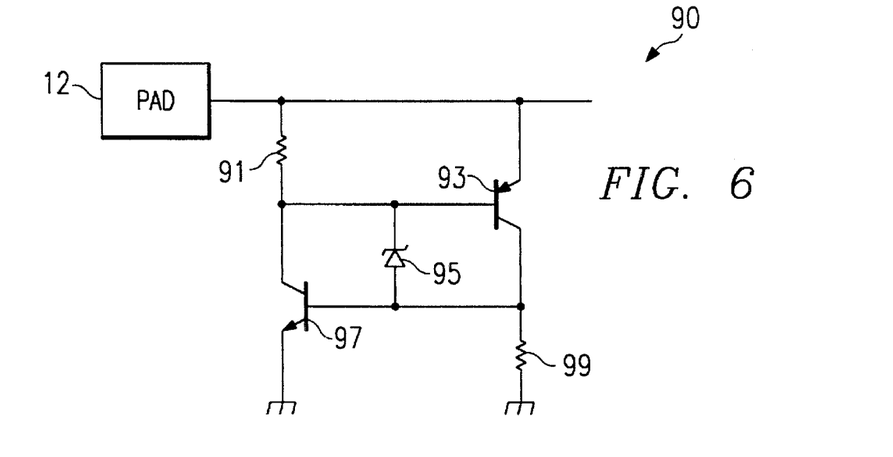
FIG. 6 is a schematic diagram illustrating a zener triggered SCR circuit 90.

FIG. 6 is a schematic diagram illustrating a zener triggered silicon controlled rectifier (SCR) circuit 90 that could be used as a primary clamp 14 as shown in FIG. 2. A PNP transistor 93 is serially coupled with a resistor 99 between pad 12 and circuit ground. A zener diode 95 is coupled across a collector terminal and a base terminal of PNP transistor 93, having an anode coupled to the collector terminal and a cathode coupled to the base terminal. A resistor 91 and an NPN transistor 97 are coupled serially between pad 12 and circuit ground. Further, zener diode 95 is coupled between a collector terminal and a base terminal of NPN transistor 97, having the anode coupled to a base terminal and the cathode connected to a collector terminal. PNP transistor 93 and NPN transistor 97 form an SCR. Zener diode 95 is used to trigger the SCR thereby reducing power dissipation in primary clamping circuit 90.

Figure 6A:
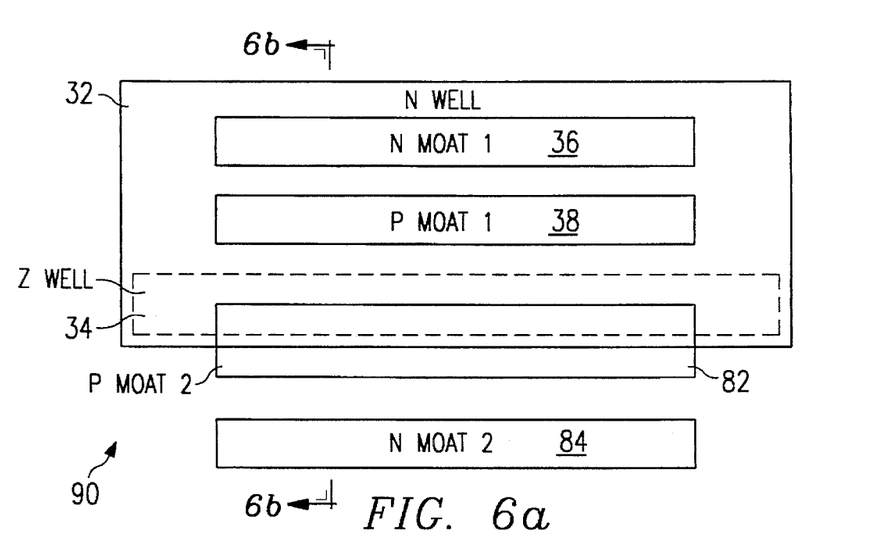
FIG. 6a is a circuit layout diagram illustrating zener triggered SCR circuit 90 of FIG. 6.

FIG. 6a is a circuit layout diagram illustrating primary clamping circuit 90 of FIG. 6 excluding resistors 91 and 99. An N-well region 32 and an N-moat 2 region 84 are formed in the substrate. N-moat 1 region 36, P-moat 1 region 38 and Z-well region 34 are all formed in N-well region 32. A P-moat 2 region 82 is formed straddling Z-well region 34 and the substrate.

Figure 6B:
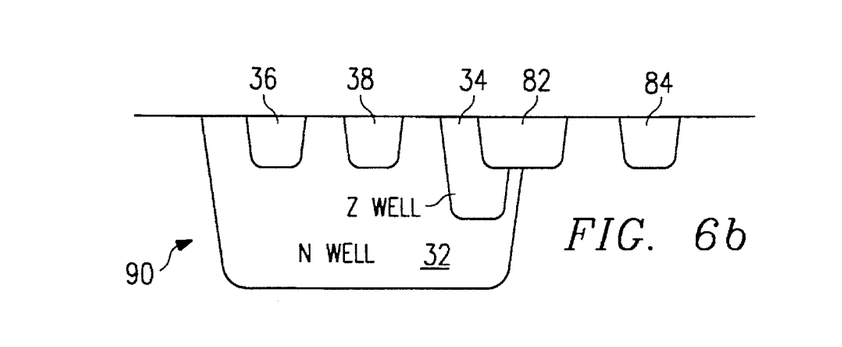
FIG. 6b is a cross section diagram illustrating zener triggered SCR circuit 90 of FIG. 6a and FIG. 6b.

FIG. 6b is a cross section diagram illustrating primary clamping circuit 90 of FIG. 6 and FIG. 6a excluding resistors 91 and 99. FIG. 6b illustrates how primary clamping circuit 90 looks if cut down the middle and rotated 90 degrees.

Figure 7:
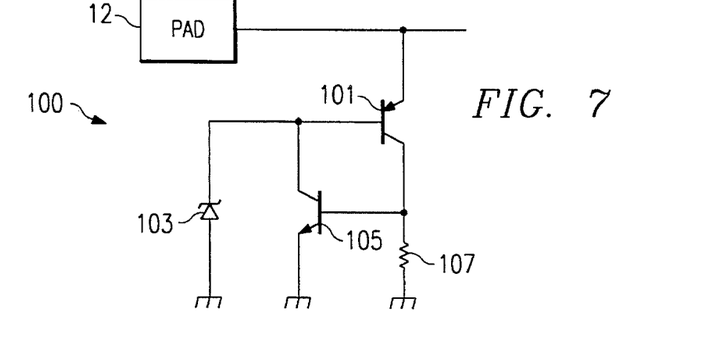
FIG. 7 is a schematic diagram illustrating an alternative zener triggered SCR circuit 100.

FIG. 7 is a schematic diagram illustrating an alternative zener triggered SCR circuit 100 that may be used as a primary clamp device such as primary clamp 14 of FIG. 2. Circuit 100 has a PNP transistor 101 serially coupled with a resistor 107 between pad 12 and circuit ground. An NPN transistor 105 has a collector terminal connected to a base terminal of PNP transistor 101, a base terminal connected to a collector terminal of PNP transistor 101, and an emitter coupled to circuit ground. A zener diode 103 is coupled in parallel with the NPN transistor 105.

Figure 7A:
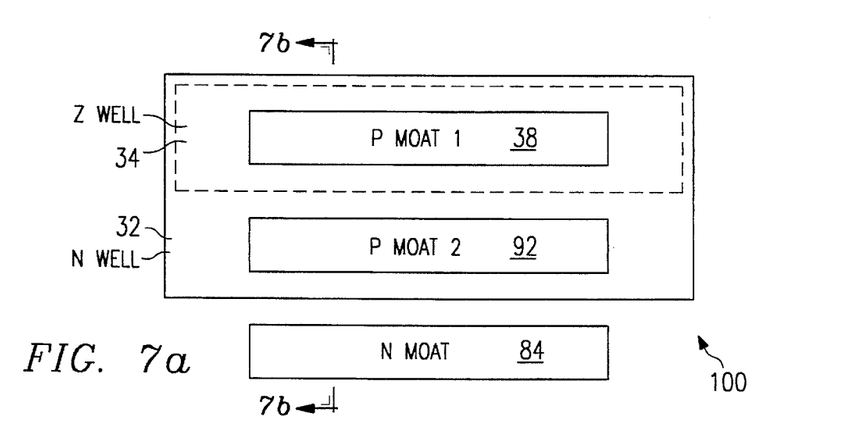
FIG. 7a is a circuit layout diagram illustrating alternative zener triggered SCR circuit 100 of FIG. 7.

FIG. 7a is a circuit layout diagram illustrating circuit 100 of FIG. 7 excluding resistor 107. An N-well region 32 and an N-moat region 84 are formed in the substrate. A Z-well region 34 and a P-moat 2 region 92 are formed in N-well region 32 and a P-moat 1 region 38 is formed in Z-well region 34.

Figure 7B:
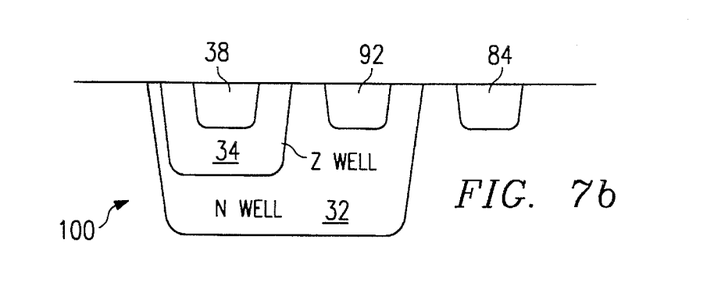

FIG. 7b is a cross section diagram illustrating alternative primary clamping circuit 100 of FIG. 7 and FIG. 7a excluding resistor 107. FIG. 7b illustrates how alternative primary clamping circuit 100 looks if cut down the middle and rotated 90 degrees.

Figure 8:
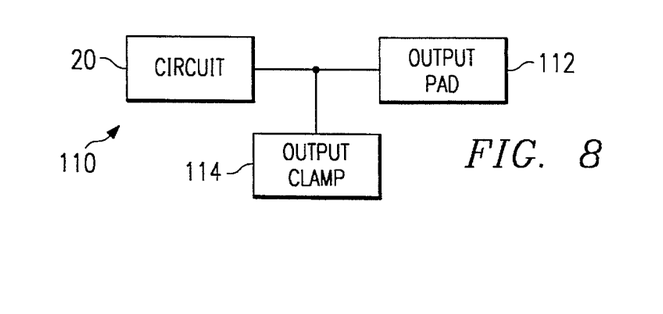
FIG. 8 is a block diagram illustrating how primary clamp circuits of FIGS. 5, 6 and 7 can be utilized in a output ESD protection circuit 110.

FIG. 8 is a block diagram illustrating novel primary clamps of FIGS. 5, 6 and 7 in an output ESD protection circuit 110. Output ESD protection circuit 110 includes circuit 20 (which is susceptible to damage due to ESD), an output clamp 114 coupled to circuit 20, and an output pad 112 coupled to both circuit 20 and output clamp 114. Output clamp 114 effectively clamps output pad 112 to a safe voltage during an ESD pulse, thereby protecting circuit 20 from damage due to electrostatic discharge.

ESD protection circuit 11 of FIG. 2 operates in the following manner. When an ESD pulse occurs at pad 12, primary clamp 14 shunts the current and clamps the voltage at pad 12. In the event of a large ESD strike, current limit 16 limits the current into zener diode 30. The prior art primary clamp 14 of FIG. 1 clamps the voltage at pad 12 to approximately 10–20 V depending on the clamp used. This voltage is still too large and will inflict damage to the gate oxide of MOS transistors within circuit 20. Zener diode 30 advantageously clamps the voltage at the input of circuit 20 to a safe voltage, (that is, a voltage lower than 10 V which is the minimum voltage that will destroy gate oxides of approximately 100 angstroms) thereby protecting the gate oxide of MOS transistors in circuit 20. Zener diode 30 substantially differs from prior art secondary clamp 18. Secondary clamp 18 of prior art FIG. 1 is composed of circuitry built using known CMOS processing (for example a CMOS process as taught in U.S. Pat. No. 4,590,663 assigned to Texas Instruments, Inc.). However, standard CMOS processing does not have any diffusions that will break down at a voltage low enough to protect the gate oxide of MOS transistors having thin gate oxides of approximately 100 angstroms. Therefore prior art secondary clamp 18 would consist of any circuitry using standard CMOS processing techniques such as an NMOS transistor having its gate connected to circuit ground. No prior art clamping structures are capable of protecting the gate oxide of MOS transistors if their gate oxides are 100 angstroms.

Zener diode 30 of FIG. 2 is constructed by adding an additional processing step to a standard CMOS process. This additional step is illustrated in FIG. 2a and FIG. 2b. After constructing an N-well diffusion 32, an N+ type diffusion, called Z-well region 34, is formed within N-well region 32. An N-moat region 36 and a P-moat region 38 are then formed within Z-well region 34. N-moat region 36 forms the cathode contact (Z-well region is the cathode for zener diode 30) and P-moat region 38 forms the anode. The doping concentration of Z-well region 34 allows one to alter the breakdown voltage of zener diode 30. If the doping concentration is increased, the zener breakdown voltage will decrease. Conversely, if the doping concentration is decreased, the zener breakdown voltage is increased. In this particular embodiment the doping concentration is approximately $1.3 \times 10^{17}/cm^3$. Therefore, with only one additional processing step, a zener diode 30 may be constructed for use as a secondary clamp in an ESD protection circuit that will effectively protect the gate oxide of MOS transistors having gate oxide thicknesses of approximately 100 angstroms because zener diode 30 will break down at approximately 7 V. Zener diode's 30 breakdown voltage is low enough to protect 100 angstrom gate oxides and high enough that is does not interfere with voltages applied during normal circuit 20 operation.

ESD protection circuit 11 of FIG. 2 protects NMOS transistors when coupled across the gate and source terminals. To protect the gate oxide of an input PMOS transistor, a second zener diode 40 may be added as shown in FIG. 3. In FIG. 3, zener diode 40 is coupled serially between supply voltage Vcc and zener diode 30. Circuit 50 of FIG. 3 provides ESD protection for both PMOS transistors and NMOS transistors simultaneously. Zener diode 40 is constructed in the same manner as zener diode 30 and breaks down when the anode of zener diode 40 falls to a large negative voltage due to a negative ESD pulse. Zener diode 40 clamps the voltage at its anode to within a breakdown voltage of Vcc (approximately 7 V) thereby protecting the gate oxide of a PMOS transistor within circuit 20.

ESD protection circuit 50 of FIG. 3 providing improved protection, may suffer from a limitation. There is a conduction path from pad 12 to Vcc through current limit 16 and zener diode 40 when the voltage at pad 12 rises approximately more than a forward diode drop above Vcc. This may be solved by supplementing zener diode 40 of FIG. 3 with a zener diode 42 coupled serially anode-to-anode as shown in FIG. 3a. Similarly, a second solution exists by supplementing zener diode 40 of FIG. 3 with a zener diode 44 coupled serially cathode-to-cathode as shown in FIG. 3b. In either circuit 52 or circuit 60, the back-to-back zener diodes will not conduct current to Vcc until the voltage across the circuit exceeds a forward biased voltage drop plus a zener breakdown voltage.

Although circuits 52 and 60 each enhance circuit 50 of FIG. 3, circuit 60 of FIG. 3b is a preferred embodiment because its circuit layout is substantially more compact, thereby saving die area and decreasing circuit cost. The anode-to-anode configuration of circuit 52 of FIG. 3a requires separate zener diodes laid out individually and coupled together by metal and one zener diode will require a guard ring because its N-well region will be coupled to pad 12 through current limit 16. This solution may occupy too much area if area is a concern. Cathode-to-cathode configuration of circuit 60 of FIG. 3b can be merged in its layout as shown in FIG. 3c. The zener diodes 40 and 44 are coupled together N-region to N-region. Because N-well region 32 is not connected to pad 12 through current limit 16 no additional guard ring is necessary. Therefore cathode-to-cathode configuration 60 of FIG. 3b is the same size as single zener diode 30 of FIG. 2a.

Zener diodes may also be incorporated into primary clamp circuits for ESD protection devices. If zener diode 30 is utilized as a primary clamp, a secondary clamp is still needed because the function of the primary clamp is to divert the high current of the ESD pulse. ESD pulses typically range from 1–10 amps. At these high currents there is a non-negligible voltage drop in the chip metallization. Secondary clamps ensure this voltage does not damage sensitive circuitry. Advantages of zener diode 30 over prior art primary clamps is that zener diode 30 triggers at a lower voltage than other primary clamps which are typically based on a transistor's BVdss. While providing benefits over the prior art, zener diode 30 of FIG. 2a may not be the best solution for a primary clamp because of its series resistance. As the current increases through zener diode 30 the voltage across it increases thereby causing its clamping voltage to increase. A gridded zener diode 70 as shown in FIG. 4 substantially decreases its associated series resistance and improves the functionality of a zener diode as a primary clamp. Gridded zener diode 70 has substantially lower series resistance because it maximizes the periphery of P-moat 72 adjacent to Z-well region 34. The current through zener diode 70 flows from N to P. The wider the conduction path the less resistance zener diode 70 exhibits. This benefit is best seen in FIG. 4b which shows gridded zener diode 70 having substantially less additional voltage drop as current through it increases as compared to zener diode 30 of FIG. 2a.

The gridded zener diode 70 of FIG. 4 is an improvement over zener diode 30 as a primary clamp, however when sinking several amps of current with a clamping voltage of approximately 7–10 V, substantial power dissipation still exists. Decreasing the amount of power dissipation in a primary clamp would be beneficial.

Amplified zener circuit 80 of FIG. 5 is an alternative primary clamp circuit that exhibits substantially lower current density through the zener diode than gridded zener diode 70 of FIG. 4. As the voltage at pad 12 begins to increase in circuit 80 due to an ESD pulse, no current is being conducted in either zener diode 81 or NPN transistor 83. When the voltage at pad 12 reaches the breakdown voltage (approximately 7 V, however may depend upon doping concentration of Z-well 34) of zener diode 81, zener diode 81 breaks down which provides base current for NPN transistor 83. When NPN transistor 83 begins to conduct, it shunts current around zener diode 81. The voltage across NPN transistor 83 during conduction is approximately the zener diode voltage plus a forward diode drop (from the base-emitter junction of transistor 83. When NPN transistor 83 pulls the voltage across zener diode 81 lower than the zener breakdown, NPN transistor 83 turns off. Therefore circuit 80 will not pull the node it's protecting any lower than the zener breakdown voltage plus a Vbe. Amplified zener circuit 80 substantially reduces the current density through zener diode 81 by distributing a large portion of the current through NPN transistor 83 which is operated in a forward biased conduction mode. Circuit 80 effectively distributes the power from an ESD pulse among zener diode 81 and NPN transistor 83, thereby minimizing hot spots and improving circuit's 80 reliability.

Zener triggered SCR circuit 90 of FIG. 6 is an alternative primary clamp circuit. Zener triggered SCR circuit 90 of FIG. 6 provides a performance improvement over amplified zener circuit 80 of FIG. 5 because the voltage drop across a conducting SCR is less than the voltage drop across a conducting bipolar transistor. When the voltage at pad 12 increases and reaches a voltage equal to the breakdown voltage of zener diode 95 due to an ESD pulse, zener diode 95 will begin conducting. As zener diode 95 begins to conduct, it supplies base current to NPN transistor 97 which then begins to conduct. As NPN transistor 97 conducts it pulls base current from PNP transistor 93 which causes it to begin conducting. As PNP transistor 93 conducts, more base current is fed to NPN transistor 97 causing it to drive harder. This, in turn, pulls more current from the base of PNP transistor 93, causing it to drive harder. PNP transistor 93 and NPN transistor 97 form an SCR. As transistors 93 and 97 each induce each other to turn on harder, they create a small "on" voltage of approximately 2–4 V between pad 12 and circuit ground. This small voltage drop is substantially less than the voltage across gridded zener diode 70 or amplified zener circuit 80 and results in substantially less power dissipation and saves die area since the size of circuit 90 does not have to be as large. Zener triggered SCR circuit 90 effectively has zener diode 95 triggering an SCR composed of transistors 93 and 97.

Zener triggered SCR circuit 90 does not occupy substantial die area as seen in FIG. 6a and FIG. 6b which exclude resistors 91 and 99. In FIG. 6a the SCR is formed by coupling transistors 93 and 97 through Z-well region 34 and P-moat 2 region 82. PNP transistor 93 is formed with P-moat 1 region 38 as its emitter (which is connected to pad 12), N-well region 32 as its base (having N-moat 1 region 36 as its base contact) and the substrate as its collector. NPN transistor 97 has Z-well region 34 as its collector, the substrate as its base, and N-moat 2 region 84 as its emitter. Zener diode 95 has P-moat 2 region 82 as its anode and Z-well region 34 as its cathode.

FIG. 7 illustrates an alternative zener triggered SCR circuit 100. When the voltage at pad 12 reaches a value equal to the breakdown voltage of zener diode 103 plus a forward biased diode drop (the p-n junction formed by the emitter-base junction of PNP transistor 101), zener diode 103 breaks down and begins pulling current from the base of PNP transistor 101 which causes PNP transistor 101 to conduct. As PNP transistor 101 conducts it provides base drive for NPN transistor 105, causing it to also conduct. Transistors 101 and 105 each cause each other to drive harder, thus forming an SCR. The small voltage drop across an SCR while conducting provides substantially less power dissipation in circuit 100.

Alternative zener triggered SCR circuit 100 of FIG. 7a represents an improvement over zener triggered SCR circuit 90 of FIG. 6a because the diffusions that make up circuit 100 may be spaced closer together because zener diode 103 is not in between the transistors. Closer spacings increase the gains of PNP transistor 101 and NPN transistor 105 thereby making a better SCR. Higher gains allow PNP transistor 101 and NPN transistor 105 to trigger easier because zener diode 103 will have to provide less base current to PNP transistor 101 to get a sufficient collector current. The layout of circuit 100 maps to its schematic (FIG. 7) as follows: a collector of NPN transistor 105 is N-well 32, a base of NPN transistor 105 is the substrate, and an emitter of NPN transistor is N-moat 84. A collector of PNP transistor 101 is the substrate, a base of PNP transistor 101 is N-well 32, and an emitter of PNP transistor 101 is P-moat2 92. An anode of zener diode 103 is P-moat1 38 and a cathode of zener diode 103 is Z-well 34.

Amplified zener circuit 80 of FIG. 5, zener triggered SCR circuit 90 of FIG. 6, and alternative zener triggered SCR circuit 100 of FIG. 7 may all also be employed as output clamp circuits such as output clamp 114 in FIG. 8. Circuits 80, 90 and 100 each would clamp output pad 112 at a substantially lower voltage than prior art output clamp, thereby reducing power dissipation during an ESD pulse and further protecting circuit 20 from ESD pulses occurring at circuit outputs.

Although the invention has been described with reference to the preferred embodiment herein, this description is not to be construed in a limiting sense. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. An electrostatic discharge protection circuit coupled between an input pad and operational circuitry that is susceptible to damage due to electrostatic discharge, comprising:

a primary clamp circuit coupled to the input pad, wherein the primary clamp clamps an electrostatic discharge voltage to a first voltage value;

a current limit circuit coupled to the primary clamp circuit; and a first zener diode coupled between the current limit circuit and a ground potential, wherein the first zener diode has cathode terminal coupled to the current limit circuit and an anode terminal coupled to the ground potential, wherein the first zener diode further clamps a voltage across the operational circuitry, and further wherein the second voltage is less than 10 V, thereby protecting the operational circuitry from damage due to electrostatic discharge.

2. The electrostatic discharge protection circuit of claim 1, wherein the first zener diode further comprises:

an N-well region formed in a semiconductor substrate;

a Z-well region formed within the N-well region, wherein the Z-well region is an N-type doped semiconductor region;

a P-moat region formed within the Z-well region; and an N-moat contact region formed within the Z-well region, wherein the P-moat region forms the anode terminal and the Z-well region forms the cathode terminal.

3. The electrostatic discharge protection circuit of claim 2, wherein the Z-well region is doped at a concentration range of $1.0 \times 10^{17}/cm^3 - 1.6 \times 10^{17}/cm^3$.

4. The electrostatic discharge protection circuit of claim 1, further comprising a second zener diode having a cathode terminal coupled to a voltage supply potential and an anode terminal coupled to the cathode terminal of the first zener diode, wherein the second zener diode protects the operational circuitry from negative electrostatic discharge voltages.

5. The electrostatic discharge protection circuit of claim 4, further comprising a third zener diode coupled in series with the second zener diode such that the third zener diode has an anode terminal coupled to the anode terminal of the second zener diode.

6. The electrostatic discharge protection circuit of claim 4, further comprising a third zener diode, coupled in series with the second zener diode such that the third zener diode has a cathode terminal coupled to the cathode terminal of the second zener diode.

7. The electrostatic discharge protection circuit of claim 1, wherein the first zener diode further comprises:

an N-well region in a semiconductor substrate;

a Z-well region formed in the N-well region, wherein the Z-well region is an N-type doped semiconductor region;

an N-moat contact region formed in the Z-well region, the N-moat region having a plurality of openings, thereby exposing the Z-well region; and a plurality of P-moat regions formed within the plurality of openings in the N-moat region, wherein the plurality of P-moat regions increase the periphery contact between the plurality of P-moat regions and the Z-well region, thereby creating a wide conduction path and a low series resistance.

8. The electrostatic discharge protection circuit of claim 1, wherein the primary clamp circuit comprises:

a fourth zener diode having a cathode terminal coupled to the input pad and an anode terminal;

a first NPN transistor having a collector terminal coupled to the input pad, a base terminal coupled to the anode terminal of the fourth zener diode, and an emitter terminal coupled to a circuit ground potential; and a first resistance coupled between the anode terminal of the fourth zener diode and the circuit ground potential, wherein the fourth zener diode breaks down when the input pad rises above a breakdown voltage of the fourth zener diode, thereby providing base drive to the first NPN transistor and causing it to conduct, wherein current is shared between the fourth zener diode and the first NPN transistor, thereby decreasing current density and improving reliability by reducing potential hot spots.

9. The electrostatic discharge protection circuit of claim 1, wherein the primary clamp circuit comprises:

a first PNP transistor having an emitter terminal coupled to the input pad, a base terminal, and a collector terminal;

a second resistance coupled between the input pad and the base terminal of the first PNP transistor;

a second NPN transistor having a collector terminal coupled to the base terminal of the first PNP transistor, a base terminal coupled to the collector terminal of the first PNP transistor, and an emitter terminal coupled to circuit ground potential;

a third resistance coupled between the collector terminal of the first PNP transistor and circuit ground potential; and a fifth zener diode having a cathode terminal coupled to the base terminal of the first PNP transistor and an anode terminal coupled to the base terminal of the second NPN transistor, wherein the fifth zener diode breaks down when an electrostatic discharge voltage at the input pad exceeds a breakdown voltage of the fifth zener diode which creates base drive to the second NPN transistor, thereby turning the second NPN transistor on, thereby pulling base current from the first PNP transistor and turning the first PNP transistor on, the first PNP transistor and second NPN transistor forming an SCR and thereby decreasing voltage across the primary clamping circuit resulting in a substantial reduction in power dissipation.

10. The electrostatic discharge protection circuit of claim 1, wherein the primary clamp circuit comprises:

a second PNP transistor having an emitter terminal coupled to the input pad, a base terminal, and a collector terminal;

a fourth resistance coupled between the collector terminal of the second PNP transistor and circuit ground potential;

a third NPN transistor having a collector terminal coupled to the base terminal of the second PNP transistor, a base terminal coupled to the collector terminal of the second PNP transistor, and an emitter terminal coupled to circuit ground potential; and a sixth zener diode coupled in parallel with the third NPN transistor, wherein the sixth zener diode breaks down when the input pad reaches a breakdown voltage of the sixth diode plus a forward biased diode drop, thereby pulling current from the base terminal of the second PNP transistor and causing it to conduct which, in turn, provides current to the base terminal of the third NPN transistor and causing it to conduct, the second PNP transistor and third NPN transistor forming an SCR and thereby decreasing voltage across the primary clamping circuit resulting in a substantial reduction in power dissipation.

11. An electrostatic discharge protection circuit coupled between a junction between an output pad and operational circuitry susceptible to damage due to electrostatic discharge and a circuit ground potential, comprising:

- a zener diode having a cathode terminal coupled to the output pad and an anode terminal;
- an NPN transistor having a collector terminal coupled to the output pad, a base terminal coupled to the anode terminal of the zener diode, and an emitter terminal coupled to the circuit ground potential; and
- a resistance coupled between the anode terminal of the zener diode and the circuit ground potential, wherein the zener diode breaks down when the output pad rises above a breakdown voltage of the zener diode, thereby providing base drive to the NPN transistor and causing it to conduct, wherein current is shared between the zener diode and the NPN transistor, thereby decreasing current density and improving reliability by reducing potential hot spots.

12. An electrostatic discharge protection circuit coupled between a junction between an output pad and operational circuitry susceptible to damage due to electrostatic discharge and a circuit ground potential, comprising:

- a PNP transistor having an emitter terminal coupled to the output pad, a base terminal, and a collector terminal;
- a resistance coupled between the output pad and the base terminal of the PNP transistor;
- an NPN transistor having a collector terminal coupled to the base terminal of the PNP transistor, a base terminal coupled to the collector terminal of the PNP transistor, and an emitter terminal coupled to the circuit ground potential;
- a second resistance coupled between the collector terminal of the PNP transistor and the circuit ground potential; and
- a zener diode having a cathode terminal coupled to the base terminal of the PNP transistor and an anode terminal coupled to the base terminal of the NPN transistor, wherein the zener diode breaks down when an electrostatic discharge voltage at the output pad exceeds a breakdown voltage of the zener diode which creates base drive to the NPN transistor, thereby mining the NPN transistor on, thereby pulling base current from the PNP transistor and turning the PNP transistor on, the PNP transistor and NPN transistor forming an SCR and thereby decreasing breakdown voltage across the electrostatic discharge protection circuit resulting in a substantial reduction in power dissipation.

13. An electrostatic discharge protection circuit coupled between a junction between an output pad and operational circuitry susceptible to damage due to electrostatic discharge and a circuit ground potential, comprising:

- a PNP transistor having an emitter terminal coupled to the output pad, a base terminal, and a collector terminal;
- a resistance coupled between the collector terminal of the PNP transistor and the circuit ground potential;
- an NPN transistor having a collector terminal coupled to the base terminal of the PNP transistor, a base terminal coupled to the collector terminal of the PNP transistor, and an emitter terminal coupled to the circuit ground potential; and
- a zener diode coupled in parallel with the NPN transistor, wherein the zener diode breaks down when the output pad reaches a breakdown voltage of the diode plus a forward biased diode drop, thereby pulling current from the base terminal of the PNP transistor and causing it to conduct which, in ram, provides current to the base terminal of the NPN transistor and causing it to conduct, the PNP transistor and NPN transistor forming an SCR and thereby decreasing voltage across the electrostatic discharge circuit resulting in a substantial reduction in power dissipation.

* * * * *